United States Patent
Haraguchi

(10) Patent No.: US 12,040,245 B2
(45) Date of Patent: Jul. 16, 2024

(54) CIRCUIT BOARD AND METHOD FOR MANUFACTURING ELECTRICAL CONNECTION BOX INCLUDING CIRCUIT BOARD

(71) Applicants: AUTONETWORKS TECHNOLOGIES, LTD., Yokkaichi (JP); SUMITOMO WIRING SYSTEMS, LTD., Yokkaichi (JP); SUMITOMO ELECTRIC INDUSTRIES, LTD., Osaka (JP)

(72) Inventor: Akira Haraguchi, Yokkaichi (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 479 days.

(21) Appl. No.: 17/598,046

(22) PCT Filed: Jan. 27, 2020

(86) PCT No.: PCT/JP2020/002773
§ 371 (c)(1),
(2) Date: Sep. 24, 2021

(87) PCT Pub. No.: WO2020/195104
PCT Pub. Date: Oct. 1, 2020

(65) Prior Publication Data
US 2022/0165636 A1    May 26, 2022

(30) Foreign Application Priority Data
Mar. 27, 2019  (JP) .................................. 2019-060938

(51) Int. Cl.
*H01L 23/31* (2006.01)
*H01L 21/56* (2006.01)
(Continued)

(52) U.S. Cl.
CPC .......... *H01L 23/3185* (2013.01); *H01L 21/56* (2013.01); *H01L 25/072* (2013.01);
(Continued)

(58) Field of Classification Search
CPC .................................................. H01L 23/3185
(Continued)

(56) References Cited

U.S. PATENT DOCUMENTS

| 5,414,928 A | 5/1995 | Bonitz et al. | |
| 2006/0267218 A1* | 11/2006 | Hozoji | H05K 3/328 257/782 |

(Continued)

FOREIGN PATENT DOCUMENTS

| JP | H5-291323 A | 11/1993 |
| JP | H09-321395 A | 12/1997 |

(Continued)

OTHER PUBLICATIONS

International Search Report, Application No. PCT/JP2020/002773, mailed Mar. 17, 2020. ISA/Japan Patent Office.

*Primary Examiner* — Ajay Arora
(74) *Attorney, Agent, or Firm* — Honigman LLP

(57) ABSTRACT

Provided is a circuit board on which an electronic component including a first terminal and a second terminal that are arranged side by side is to be mounted, the circuit board including: an insulating holding member, a conductive plate, and a signal circuit, in which the conductive plate is held by the holding member, the first terminal is joined to the conductive plate, the signal circuit is formed on a surface of the holding member using conductive nanoink containing a (Continued)

flux, and an end portion of the signal circuit and the second terminal are joined to each other using solder.

4 Claims, 16 Drawing Sheets

(51) Int. Cl.
  *H01L 25/07* (2006.01)
  *H01L 23/00* (2006.01)
  *H01L 23/14* (2006.01)
  *H01L 23/538* (2006.01)

(52) U.S. Cl.
  CPC .......... *H01L 23/145* (2013.01); *H01L 23/538* (2013.01); *H01L 24/83* (2013.01); *H01L 2224/83192* (2013.01); *H01L 2224/83815* (2013.01)

(58) Field of Classification Search
  USPC .......................................................... 257/773
  See application file for complete search history.

(56) References Cited

U.S. PATENT DOCUMENTS

| | | | |
|---|---|---|---|
| 2010/0089980 | A1* | 4/2010 | Maeda ................. B23K 3/0623 228/256 |
| 2010/0093131 | A1* | 4/2010 | Maeda .................... H01L 24/11 257/E21.705 |
| 2020/0051911 | A1 | 2/2020 | Nakamura et al. |

FOREIGN PATENT DOCUMENTS

| | | |
|---|---|---|
| JP | 2003-164040 A | 6/2003 |
| JP | 2006-005096 A | 1/2006 |
| JP | 2009-070727 A | 4/2009 |
| JP | 2013-074244 A | 4/2013 |

\* cited by examiner

1

CIRCUIT BOARD AND METHOD FOR MANUFACTURING ELECTRICAL CONNECTION BOX INCLUDING CIRCUIT BOARD

CROSS-REFERENCE TO RELATED APPLICATIONS

This application is the U.S. national stage of PCT/JP2020/002773 filed on Jan. 27, 2020, which claims priority of Japanese Patent Application No. JP 2019-060938 filed on Mar. 27, 2019, the contents of which are incorporated herein.

TECHNICAL FIELD

The present invention relates to a circuit board and a method for manufacturing an electrical connection box including a circuit board.

BACKGROUND

A heat-dissipating substrate for electronic component mounting has been known which is composed of a metal plate punched into the form of a predetermined wiring pattern and a high thermal conductivity composite insulating material, the high thermal conductivity composite insulating material being formed in one piece with the metal plate in a state where at least a component mounting portion of the metal plate is exposed (e.g., see JP H09-321395A). The metal plate included in the heat-dissipating substrate (circuit board) for electronic component mounting of JP H09-321395A is punched into the form of a predetermined wiring pattern and bending or drawing is carried out on at least a portion thereof.

Accompanying a reduction in size of an electronic component mounted on a circuit board, the distance between terminals of the electronic component, that is, the terminal pitch, tends to become smaller, and in the circuit board of JP H09-321395A, there is concern that it will be difficult to mount an electronic component having such a narrow terminal pitch.

An object of the present disclosure is to provide a circuit board or the like on which an electronic component having a narrow terminal pitch can be mounted.

SUMMARY

A circuit board according to one aspect of the present disclosure is a circuit board on which an electronic component including a first terminal and a second terminal that are arranged side by side is to be mounted, the circuit board including: an insulating holding member; a conductive plate; and a signal circuit, in which the conductive plate is held by the holding member, the first terminal is joined to the conductive plate, the signal circuit is formed on a surface of the holding member using conductive nanoink containing a flux, and an end portion of the signal circuit and the second terminal are joined to each other using solder.

Effect of the Disclosure

According to one aspect of the present disclosure, it is possible to provide a circuit board or the like on which an electronic component having a narrow terminal pitch can be mounted.

DESCRIPTION OF EMBODIMENTS OF THE PRESENT DISCLOSURE

Figure 1:
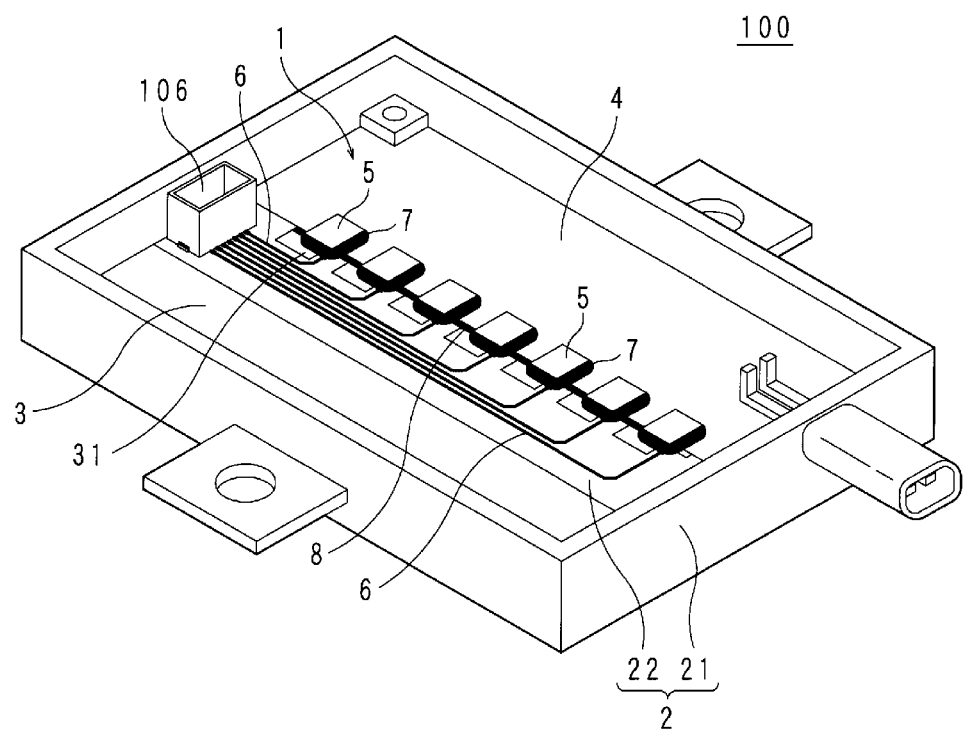
FIG. 1 is a perspective view of an electrical connection box including a circuit board according to a first embodiment.

First, embodiments of the present disclosure will be listed and described. Also, at least a portion of the embodiments described below may be combined as appropriate.

A circuit board according to one aspect of the present disclosure is a circuit board on which an electronic component including a first terminal and a second terminal that are arranged side by side is to be mounted, the circuit board including: an insulating holding member; a conductive plate; and a signal circuit, in which the conductive plate is held by the holding member, the first terminal is joined to the conductive plate, the signal circuit is formed on a surface of the holding member using conductive nanoink containing a flux, and an end portion of the signal circuit and the second terminal are joined to each other using solder.

In this aspect, when mounting the electronic component including the first terminal and the second terminal arranged side by side on the circuit board, the first terminal is joined to the conductive plate and the second terminal is joined to the signal circuit. Since the signal circuit is made of conductive nanoink, it is possible to provide a circuit board on which electronic components in which the terminal pitch (distance between terminals) between the first terminal and the second terminal arranged side by side is narrow are mounted. Since the signal circuit is made of conductive nanoink containing a flux, the wettability of the conductive nanoink with respect to solder is improved, and the end portion of the signal circuit and the second terminal can be suitably joined together (soldered) with solder.

In a circuit board according to one aspect of the present disclosure, resin molding is carried out on the end portion of the signal circuit and the second terminal that are joined to each other using the solder.

In this aspect, the joining strength at the joined portion can be improved by resin-molding the end portion of the signal circuit and the second terminal joined using solder, that is, the joined portion between the end portion of the signal circuit and the second terminal.

In a circuit board according to one aspect of the present disclosure, a coefficient of linear expansion of a resin of the resin molding is smaller than a coefficient of linear expansion of the holding member.

The coefficient of linear expansion of the resin material of the resin molding is smaller than the coefficient of linear expansion of the holding member. Accordingly, it is possible to improve the joining strength with respect to thermal shock (thermal stress generated due to the temperature difference of the ambient temperature) at the joined portion between the end portion of the signal circuit and the second terminal.

A circuit board according to one aspect of the present disclosure further includes a second conductive plate, in which the electronic component further includes a third terminal that is to be joined to the second conductive plate, the second conductive plate and the conductive plate are arranged side by side with a side surface of the second conductive plate and a side surface of the conductive plate facing each other, and the resin of the resin molding fills a region between the side surface of the second conductive plate and the side surface of the conductive plate.

In this aspect, since the resin material of the resin molding fills the region between the side surface of the second conductive plate and the side surface of the conductive plate, the insulation between the conductive plate and the second conductive plate can be reliably ensured. By filling in the gap between the side surface of the second conductive plate and the side surface of the conductive plate with a resin that is different from the resin forming the holding member, the stress caused by the difference between the material coefficients of these components can be mitigated. Since the filling of the gap formed between the side surface of the second conductive plate and the side surface of the conductive plate with the resin material is performed at the same time as the resin molding for joining the end portion of the signal circuit and the second terminal, the efficiency of the manufacturing process can be increased.

In a circuit board according to one aspect of the present disclosure, a protrusion that protrudes in a vertical-line direction from one surface is provided on one surface of the conductive plate, and the first terminal is joined to the protrusion.

In this aspect, by using the protruding portion provided on the conductive plate as a portion for mounting the first terminal, the need for another connecting component (connection point) interposed between the conductive plate and the first terminal can be eliminated, and thus the electrical resistance between the first terminal and the conductive plate can be reduced, and the amount of heat generated when a current flows can be suppressed.

A method for manufacturing an electrical connection box including a circuit board according to one aspect of the present disclosure is a method for manufacturing an electrical connection box including a circuit board, the method including: a step of arranging a conductive plate in a mold, injecting resin in the mold to form a holding member including an outer frame and a mounting plate portion, and integrating the conductive plate and the holding member such that at least a portion of the conductive plate is accommodated in the outer frame; a step of printing a signal circuit on the mounting plate portion using conductive nanoink containing a flux; a step of applying solder paste to a predetermined region of the conductive plate and an end portion of the signal circuit; a step of aligning each of a first terminal and a second terminal of an electronic component with the predetermined region of the conductive plate and the end portion of the signal circuit to which the solder paste has been applied, placing the electronic component, and performing soldering using a reflow furnace; a step of performing resin potting in a groove formed on a side surface side of the mounting plate portion, and performing resin molding using the same resin as in the resin potting on a peripheral edge of the electronic component so as to include the applied solder paste; and a step of accommodating a control circuit board for controlling the electronic component in the outer frame, and fixing an upper lid and a heat sink so as to close opening portions on both ends of the outer frame.

In this aspect, it is possible to provide an electrical connection box that includes a circuit board on which an electronic component with a narrow terminal pitch can be mounted.

A specific example of a circuit board 1 and method for manufacturing an electrical connection box 100 including the circuit board 1 according to the embodiment of the present disclosure will be described below with reference to the drawings. It should be noted that the present disclosure is not limited to these examples, and is indicated by the scope of claims, and is intended to encompass all modifications within the meaning and range of equivalency to the claims.

Embodiment 1

FIG. 1 is a perspective view of the electrical connection box 100 including the circuit board 1 according to the first embodiment. FIG. 1 shows a state in which an upper lid 102 of the electrical connection box 100 and a control circuit board 101 (see FIG. 14) have been removed in the description of the circuit board 1. The circuit board 1 is accommodated in the electrical connection box 100. The circuit board 1 includes a holding member 2, electronic components 5, a conductive plate 3, a second conductive plate 4, a connector terminal 105, and a substrate connection connector 106.

The holding member 2 includes a rectangular outer frame 21 forming an outer shell of the electrical connection box 100 and a mounting plate portion 22 on which signal circuits 6 are formed, and holds the conductive plate 3, the second conductive plate 4, and the connector terminal 105. A base portion of the circuit board 1 is formed by the mounting plate portion 22, the conductive plate 3, and the second conductive plate 4.

The electronic components 5 are mounted on the surface of the mounting plate portion 22, and the signal circuits 6, through which the electronic components 5 and the substrate connection connector 106 are electrically joined together to perform electrical conduction, are formed.

A plurality of the electronic components 5 are arranged side by side on the circuit board 1, and the plurality of electronic components 5 are arranged (mounted) so as to straddle the conductive plate 3 and the second conductive plate 4. Each of the plurality of electronic components 5 is connected to the substrate connection connector 106 by a signal circuit 6.

A resin molded portion 7 is formed on the peripheral edge of each electronic component 5, and the resin molded portion 7 is provided so as to cover a joined portion between the electronic component 5 and another component. The resin forming the resin molded portion 7 fills the gap formed between the conductive plate 3 and the second conductive plate 4, and forms a rod body 8 by filling the gap.

A control circuit board 101 (see FIG. 15) connected to the substrate connection connector 106 outputs a control signal for controlling the electronic components 5 via the substrate connection connector 106, and the output control signal is input to, for example, an electronic component 5 such as a semiconductor switch. Upon receiving the control signal, the electronic component 5 (semiconductor switch) causes electrical conduction between the conductive plate 3 and the second conductive plate 4 by closing (turning on) a switch. The electrical connection box 100 including the circuit board 1 configured in this way is interposed between, for example, a power storage device (not shown) such as a lithium battery mounted in a vehicle, and an in-vehicle load (not shown), and is used as a power supply device for a vehicle.

Figure 2:
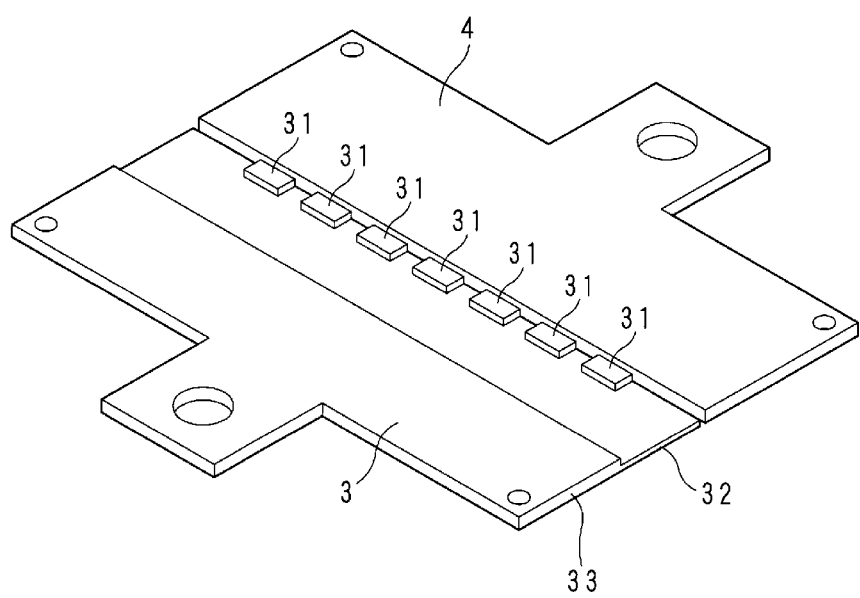
FIG. 2 is an illustrative diagram showing a configuration of a conductive plate.

FIG. 2 is an illustrative diagram showing the configuration of the conductive plate 3. As described above, the circuit board 1 includes the conductive plate 3 and the second conductive plate 4 as conductive members. FIG. 2 shows the conductive plate 3 and the second conductive plate 4 in a state where the holding member 2 has been removed.

The conductive plate 3 is made of a metal having good conductivity, such as pure copper or a copper alloy (copper, etc.), and is called a bus bar. The conductive plate 3 may have a nickel-plated surface. The conductive plate 3 has a protruding shape in a plan view, and includes a thick portion 32 and a thin portion 33 with a smaller plate thickness than that of the thick portion 32.

A protruding piece portion with a protruding shape is formed on the thick portion 32, and a hole is provided in the central portion of the protruding piece portion. As shown in FIG. 1, the protruding piece portion is provided so as to protrude outward from an outer frame 21, and is used as a fastening portion for electrically connecting to another electrical component when the electrical connection box 100 is mounted in the vehicle.

The thin portion 33 has a rectangular shape, and a plurality of protruding portions 31 protruding in a vertical-line direction from the surface of the thin portion 33 are arranged side by side on an edge side (near the long side) in the lateral direction of the thin portion 33. Each of the plurality of protrusions 31 has a rectangular shape, and each of the plurality of protrusions 31 is provided on the surface of the thin portion 33 such that the edge in the lateral direction of the protrusion 31 (the long side of the protrusion 31) extends along the edge in the lateral direction of the thin portion 33 (the long side of the thin portion 33). Although the details will be described later, the protrusions 31 are used as portions for mounting terminals of the electronic components 5.

The size of the plate thickness (plate width) of the thick portion 32 and the size of the total value of the plate thicknesses (plate widths) of the thin portion 33 and the protrusions 31 are the same. In other words, the surface of the thick portion 32 and the upper surfaces (surfaces) of the protrusions 31 are located on the same plane and form a so-called flush form.

For example, the second conductive plate 4 is made of a metal having good conductivity such as copper, and is preferably made of the same material as the conductive plate 3. The surface of the second conductive plate 4 may be nickel-plated. The second conductive plate 4 has a protruding shape similarly to the conductive plate 3, and a hole is provided in the central portion of the protruding piece portion of the protruding shape. The protruding piece portion of the second conductive plate 4 is also provided so as to protrude outward from the outer frame 21 similarly to the conductive plate 3, and is used as a fastening portion for electrically connecting to another electrical component when the electrical connection box 100 is mounted in the vehicle.

The conductive plate 3 and the second conductive plate 4 are arranged so that the side surfaces in the longitudinal direction (long sides) on which the protruding piece portions are not provided face each other. In other words, a gap is formed between the side surface in the longitudinal direction (long side) of the conductive plate 3 on which the protruding piece portion is not provided and the side surface in the longitudinal direction (long side) of the second conductive plate 4 on which the protruding piece portion is not provided. Due to the gap, the conductive plate 3 and the second conductive plate 4 are arranged so as to be in a non-contact state. Each end portion in the longitudinal direction of the gap is filled with the resin forming the holding member 2. Although the details will be described later, some of the resin forming the resin molded portion 7 fills the remaining portion other than the end portions in the longitudinal direction of the gap. The rod body 8 is formed by filling the remaining portion with some of the resin forming the resin molded portion 7. Accordingly, the insulation between the conductive plate 3 and the second conductive plate 4 is ensured by filling the gap with the resin forming the holding member 2 and the resin forming the resin molded portion 7.

The surface of the thick portion 32 of the conductive plate 3 and the surface of the second conductive plate 4 are located on the same plane and form a so-called flush form.

Figure 3:
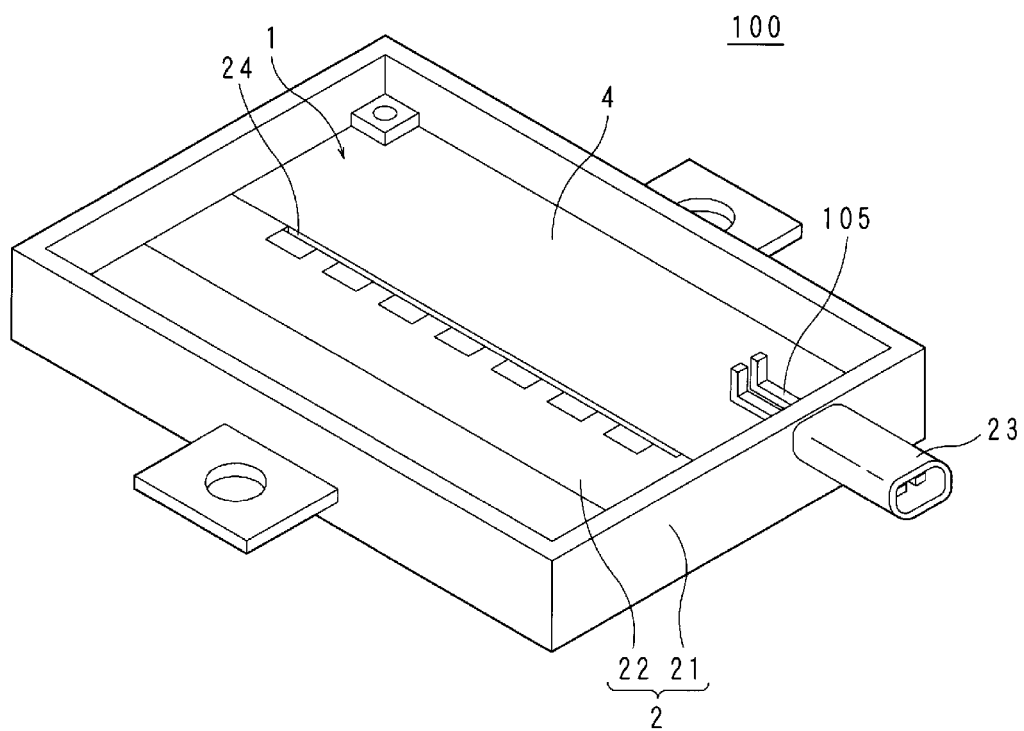
FIG. 3 is a perspective view of a state in which the conductive plate and a holding member are formed in one piece.

FIG. 3 is a perspective view showing a state in which the conductive plate 3 and the holding member 2 are integrated. The conductive plate 3, the second conductive plate 4, and two L-shaped connector terminals 105 are held by the holding member 2 made of insulating resin.

The conductive plate 3 and the second conductive plate 4 are fixed in a mold in the arrangement state shown in FIG. 2, the connector terminal 105 is further fixed in the mold, and the circuit board 1 (bus bar insert board) in which the conductive plate 3, the second conductive plate 4, the connector terminal 105, and the holding member 2 (mounting plate portion 22) are integrated is formed through insert molding in which a resin serving as the material of the holding member 2 is injection-molded in the mold.

The holding member 2 is molded from an insulating resin, and for example, the resin is a thermoplastic resin such as PPS (polyphenylene sulfide). The holding member 2 includes the outer frame 21 and the mounting plate portion 22.

The outer frame 21 has a rectangular frame body and forms the outer shell of the electrical connection box 100. The circuit board 1 composed of the conductive plate 3, the second conductive plate 4, and the mounting plate portion 22 is located inside of the outer frame 21.

The mounting plate portion 22 has a rectangular shape and is provided between the thick portion 32 of the conductive plate 3 and the second conductive plate 4. In other words, the mounting plate portion 22 is stacked so as to cover the surface of the thin portion 33 of the conductive plate 3. The thickness of the mounting plate portion 22 is set such that the upper surfaces (surfaces) of the protrusions 31 provided so as to protrude on the thin portion 33 of the conductive plate 3 are exposed. Accordingly, the surface of the thick portion 32 of the conductive plate 3, the surface of the mounting plate portion 22, the upper surfaces (surfaces) of the protrusions 31 provided so as to protrude on the thin portion 33 of the conductive plate 3, and the surface of the second conductive plate 4 are located on the same plane, and form a so-called flush form.

A groove 24 is provided between the side surface of the mounting plate portion 22 and the side surface of the second conductive plate 4. The groove 24 is formed by not being filled with the resin of the holding member 2. The groove 24 is provided so as to include at least the region of the edge portion at which the protrusions 31 are provided. Accordingly, the groove 24 is located between the side surface of each of the protrusions 31 and the side surface of the second conductive plate. The shape of the surface of the mounting plate portion 22 is a recessed shape obtained by cutting out the region of the groove 24 in a plan view from the shape of the surface of the thin portion 33 of the conductive plate 3.

A tubular connector housing 23 is provided on the outer peripheral surface of the outer frame 21. A hole for inserting the connector terminal 105 is provided at the location of the outer frame 21 at which the connector housing 23 is provided, and the connector terminal 105 is provided inside of the connector housing 23 so as to penetrate through the outer frame 21, and enables electrical connection between the inside and outside of the outer frame 21.

Figure 4:
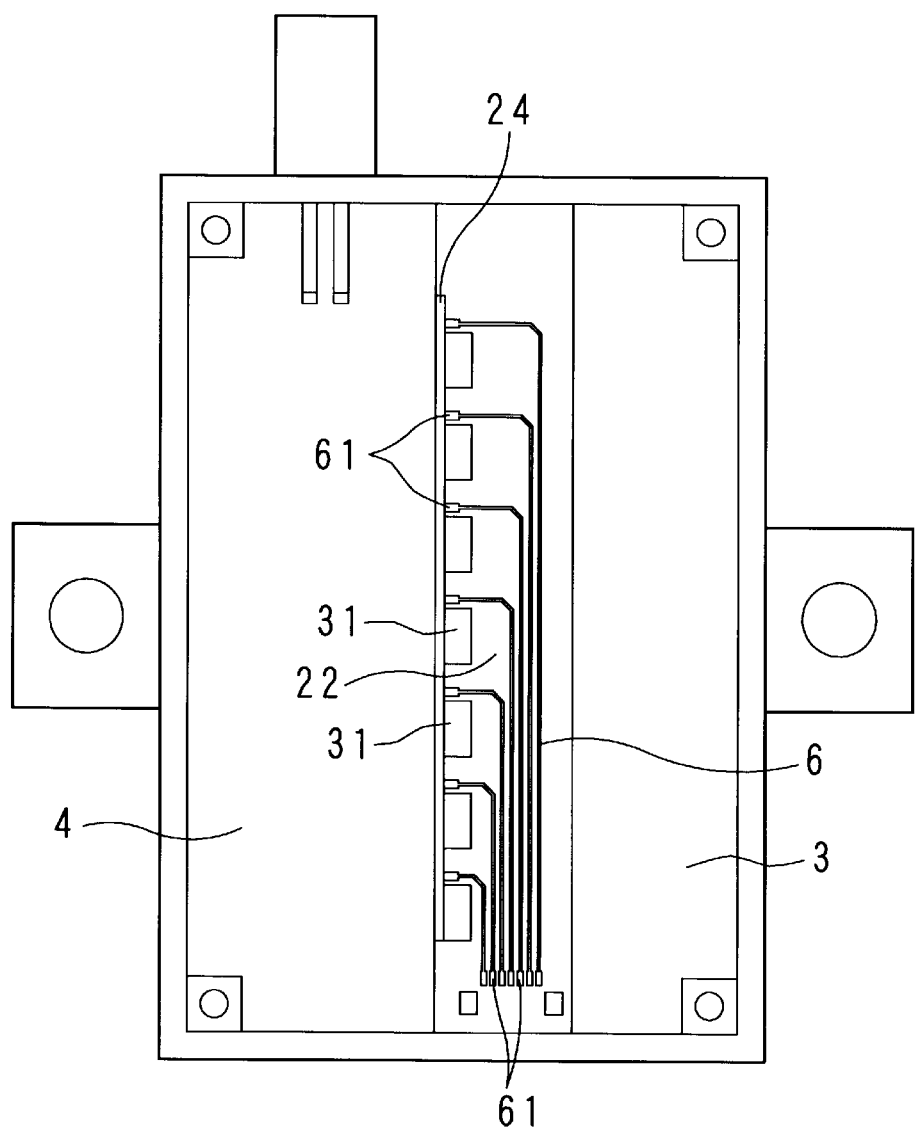
FIG. 4 is a plan view of a state in which a signal circuit is provided on a mounting plate portion of the holding member.

FIG. 4 is a plan view of a state in which the signal circuits 6 are provided on the mounting plate portion 22 of the holding member 2. The signal circuits 6 are provided on the mounting plate portion 22. For example, the signal circuits 6 are made of a conductive nanoink such as conductive copper nanoink. That is, the signal circuits 6 are formed by printing the conductive copper nanoink on the surface of the mounting plate portion 22. Each of the signal circuits 6 printed (formed) on the surface of the mounting plate portion 22 using the conductive copper nanoink is L-shaped, and the long side portions of the L-shaped portions are provided side by side on the mounting plate portion 22.

Conductive copper nanoink is obtained by dispersing copper nanoparticles of several to several tens of nanometers in a liquid. When the conductive copper nanoink is printed (applied and dried) on the surface of the mounting plate portion 22, a thin film in which copper nanoparticles are densely arranged side by side can be obtained. When the copper nanoparticles formed into the thin film (coating film) are subjected to heat treatment, the particles fuse to each other due to a drop in the melting point unique to the nanoparticles, and form a metal bond. As a result, a coating film obtained using the copper nanoink becomes similar to a metal foil (copper foil).

The conductive copper nanoink (conductive nanoink) contains a flux for improving the wettability with respect to solder. A conductive nanoink containing a flux is a conductive nanoink in which a component that functions as a flux when soldering, such as an amine-based organic compound (alkanolamine), is included (blended) (e.g., see JP 2017-4732A), or is obtained by coating the surface of conductive nanoink printed on the holding member 2 with a flux. Since the signal circuit 6 is made of a conductive copper nanoink (conductive nanoink) containing a flux, the wettability of the conductive copper nanoink (conductive nanoink) with respect to solder can be improved. Accordingly, the end portion 61 of the signal circuit 6 and the second terminal 52 (see FIG. 7) of the electronic component 5 can be suitably joined (soldered) using solder paste 9.

Figure 5:
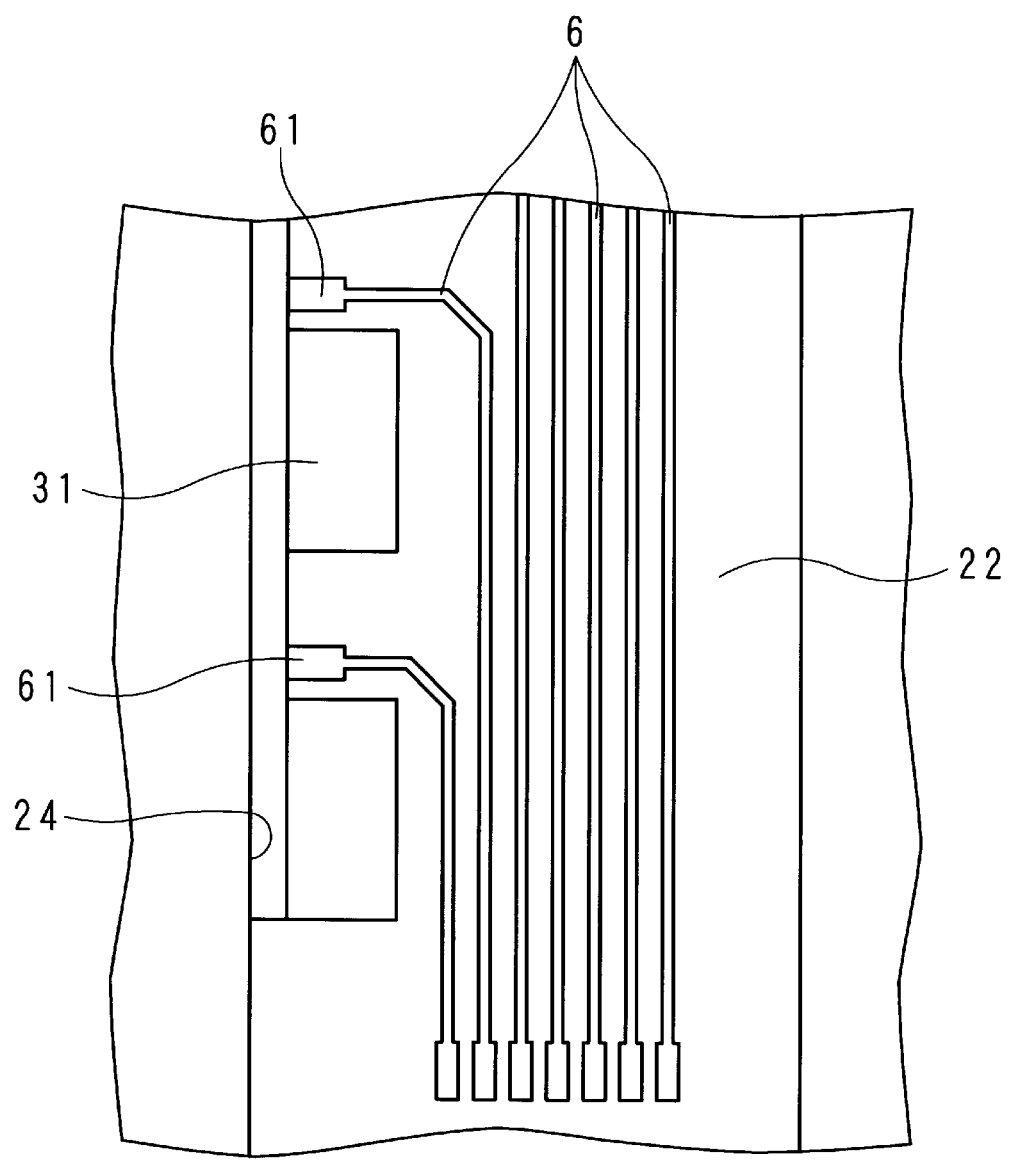
FIG. 5 is an illustrative diagram of an end portion of the signal circuit.

FIG. 5 is an illustrative diagram of the end portions 61 of the signal circuits 6. FIG. 5 shows each of the end portions 61 of the signal circuits 6 in FIG. 4 in an enlarged manner. The width of each of the two end portions 61 of the signal circuits 6 is wider than the width of the linear portion located between each of the two end portions 61. Each of the end portions 61 of the signal circuits 6 is provided so as to be aligned with the positions of the second terminals 52 of the electronic components 5 to be mounted on the circuit board 1 and the substrate connection connector 106.

The end portion 61 on the electronic component 5 side of the signal circuit 6 is provided adjacent to the short side of the protrusion 31 and close to the groove 24. The end portion 61 on the substrate connection connector 106 side of the signal circuit 6 is provided so as to converge toward the end portion in the longitudinal direction of the mounting plate portion 22. By forming each of the two end portions 61 of the signal circuit 6 wide, the signal circuit 6 can be reliably joined to the electronic component 5 and the substrate connection connector 106.

Figure 6:
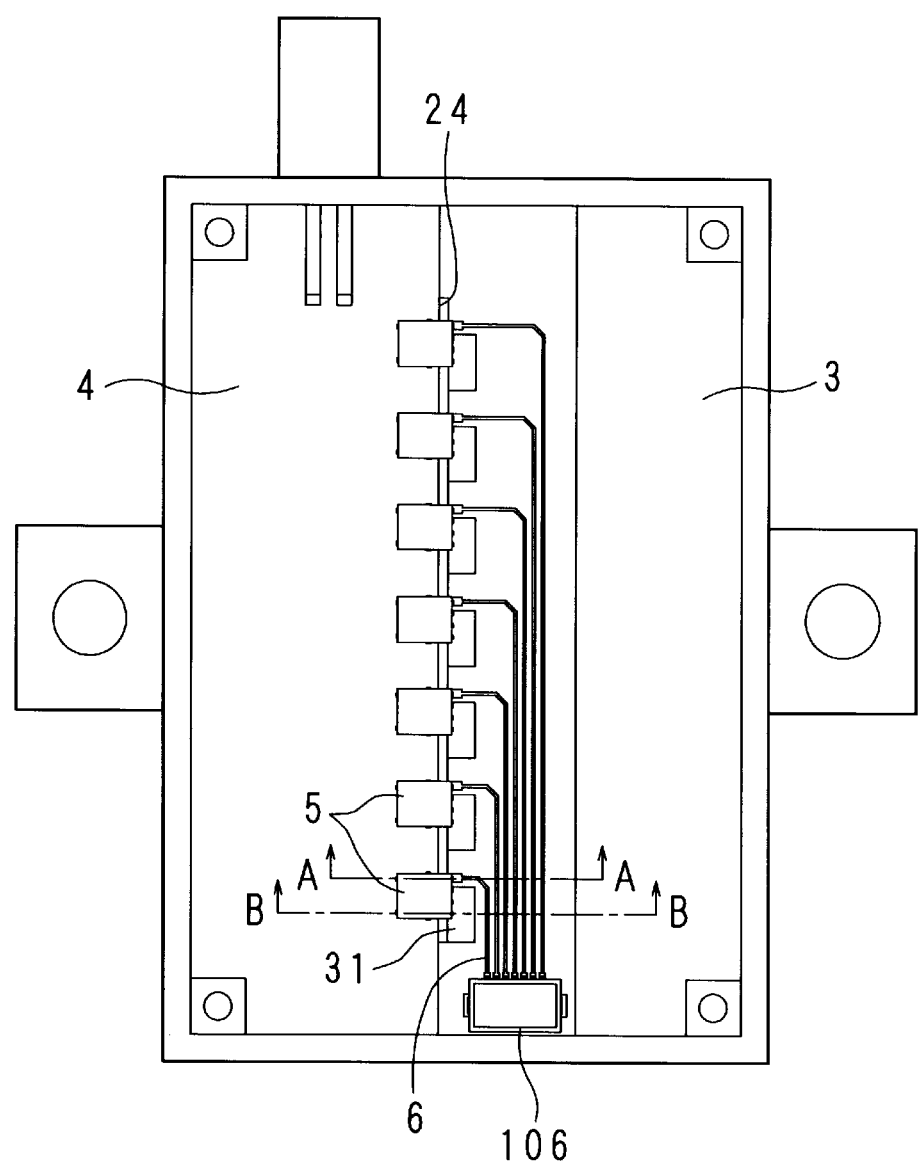
FIG. 6 is a plan view of an electrical connection box including a circuit board before resin molding.

FIG. 6 is a plan view of the electrical connection box 100 including the circuit board 1 before resin molding. FIG. 6 shows a state in which the electronic components 5 are mounted. A plurality of electronic components 5 are arranged side by side along the longitudinal direction of the mounting plate portion 22 so as to straddle the second conductive plate 4 and the mounting plate portion 22.

The electronic component 5 includes an external peripheral device 54 in which an electrical circuit is packaged (included), and a first terminal 51, a second terminal 52, and a third terminal 53 that are provided protruding from the peripheral edge of the external peripheral device 54 (see FIGS. 7 and 8), and is, for example, an n-type FET (field effect transistor). The first terminal 51 and the second terminal 52 protrude from the same edge portion of the external peripheral device 54 and are arranged side by side.

If the electronic component 5 is an n-type FET, the first terminal 51 corresponds to a source terminal, the second terminal 52 corresponds to a gate terminal, and the third terminal 53 corresponds to a drain terminal. The first terminal 51 (source terminal) is joined to the upper surface (surface) of the protrusion 31 of the conductive plate 3 (output-side bus bar) using the solder paste 9. The second terminal 52 (gate terminal) is joined to the end portion 61 of the signal circuit 6 using the solder paste 9. The third terminal 53 (drain terminal) is joined to the surface of the second conductive plate 4 (input-side bus bar) using the solder paste 9. The end portion 61 on the substrate connection connector 106 side of the signal circuit 6 is joined to the substrate connection connector 106 using the solder paste 9.

Figure 7:
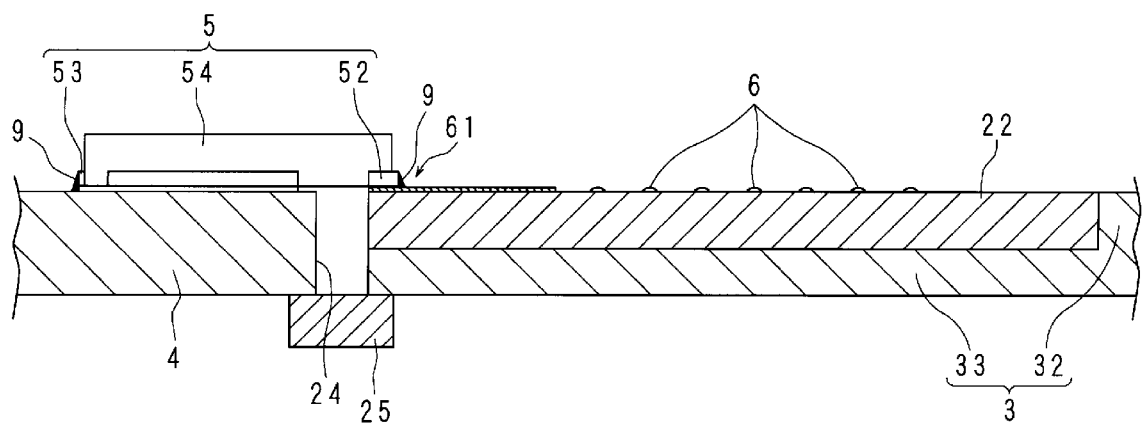
FIG. 7 is a schematic cross-sectional view of a main part (A-A) of a circuit board.

FIG. 7 is a schematic cross-sectional view of a main part (A-A) of the circuit board. FIG. 7 schematically shows a cross section (A-A) of FIG. 6, and is a schematic cross-sectional view in a state before resin molding is carried out (before the resin molded portion 7 is formed).

The groove 24 is formed between the side surface of the conductive plate 3 and the side surface of the second conductive plate 4. A bottom lid portion 25 is provided so as to close the groove 24 from the underside surface side of the conductive plate 3 and the second conductive plate 4.

The bottom lid portion 25 is a portion generated when the holding member 2 is insert-molded, and is included in the holding member 2. The bottom lid portion 25 is a columnar member that is provided so as to bridge the inner peripheral surfaces of the outer frame 21 along the gap provided between the side surface in the longitudinal direction of the conductive plate 3 in which the protruding piece portion is not provided and the side surface in the longitudinal direction of the second conductive plate 4 in which the protruding piece portion is not provided. The bottom lid portion 25 is provided so as to straddle the second conductive plate 4 and the conductive plate 3 from the back surface side, and closes the groove 24 from the back surface side.

The surface (upper surface) of the second conductive plate 4, the surface of the mounting plate portion 22, and the surface (upper surface) of the thick portion 32 of the conductive plate 3 are located on the same plane and form a so-called flush form. The resin forming the mounting plate portion 22, that is, the resin of the holding member 2, fills part of the gap between the second conductive plate 4 and the conductive plate 3.

The electronic component 5 is mounted on the surface side of the mounting plate portion 22 (the surface side of the base portion of the circuit board 1) such that the external peripheral device 54 of the electronic component 5 straddles the second conductive plate 4 and the end portion 61 of the signal circuit 6. If the electronic component 5 is an n-type FET, the second terminal 52 (gate terminal) of the electronic component 5 (n-type FET) is placed on the end portion 61 of the signal circuit 6 and the second terminal 52 (gate terminal) and the end portion 61 of the signal circuit 6 are joined together using the solder paste 9. As described above, the conductive copper nanoink forming the signal circuit 6 contains a flux and has high wettability with respect to solder, and therefore the joinability between the end portion 61 of the signal circuit 6 and the second terminal 52 (gate terminal) can be improved.

The third terminal 53 (drain terminal) of the electronic component 5 (n-type FET) is placed on the surface of the second conductive plate 4 (input-side bus bar), and the third terminal 53 and the second conductive plate 4 are joined together using the solder paste 9 applied on the surface.

Figure 8:
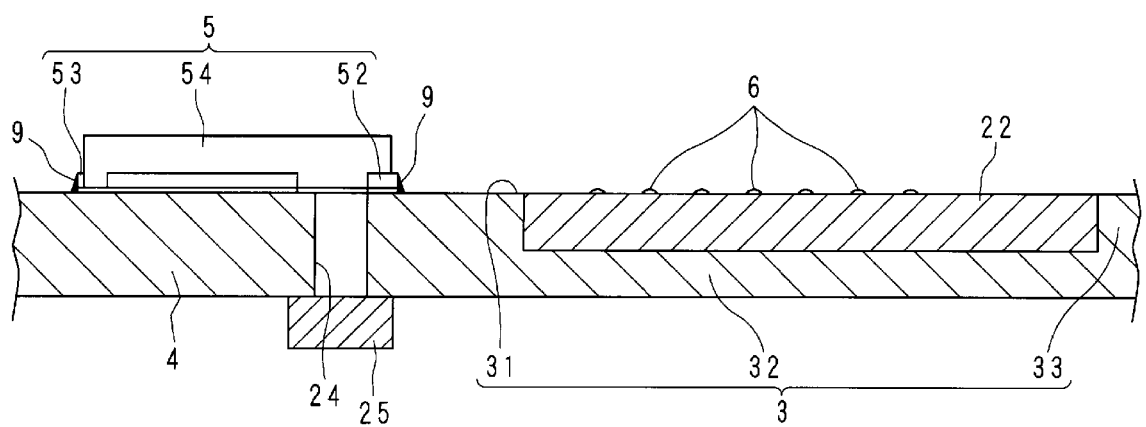
FIG. 8 is a schematic cross-sectional view of a main part (B-B) of a circuit board.

FIG. 8 is a schematic cross-sectional view of a main part (B-B) of the circuit board. FIG. 8 schematically shows a cross section (B-B) of FIG. 6, and is a schematic cross-sectional view including the protrusion 31. The description of portions common to FIG. 7 will be omitted.

The electronic component 5 is mounted on the surface side of the mounting plate portion 22 (the surface side of the base portion of the circuit board 1) such that the external peripheral device 54 of the electronic component 5 straddles the second conductive plate 4 and the protrusion 31 of the conductive plate 3. The first terminal 51 (source terminal) of the electronic component 5 (n-type FET) is placed on the upper surface (on the surface) of the protrusion 31 of the conductive plate 3, and the first terminal 51 and the conductive plate 3 are joined together by the solder paste 9 applied on the surface.

Figure 9:
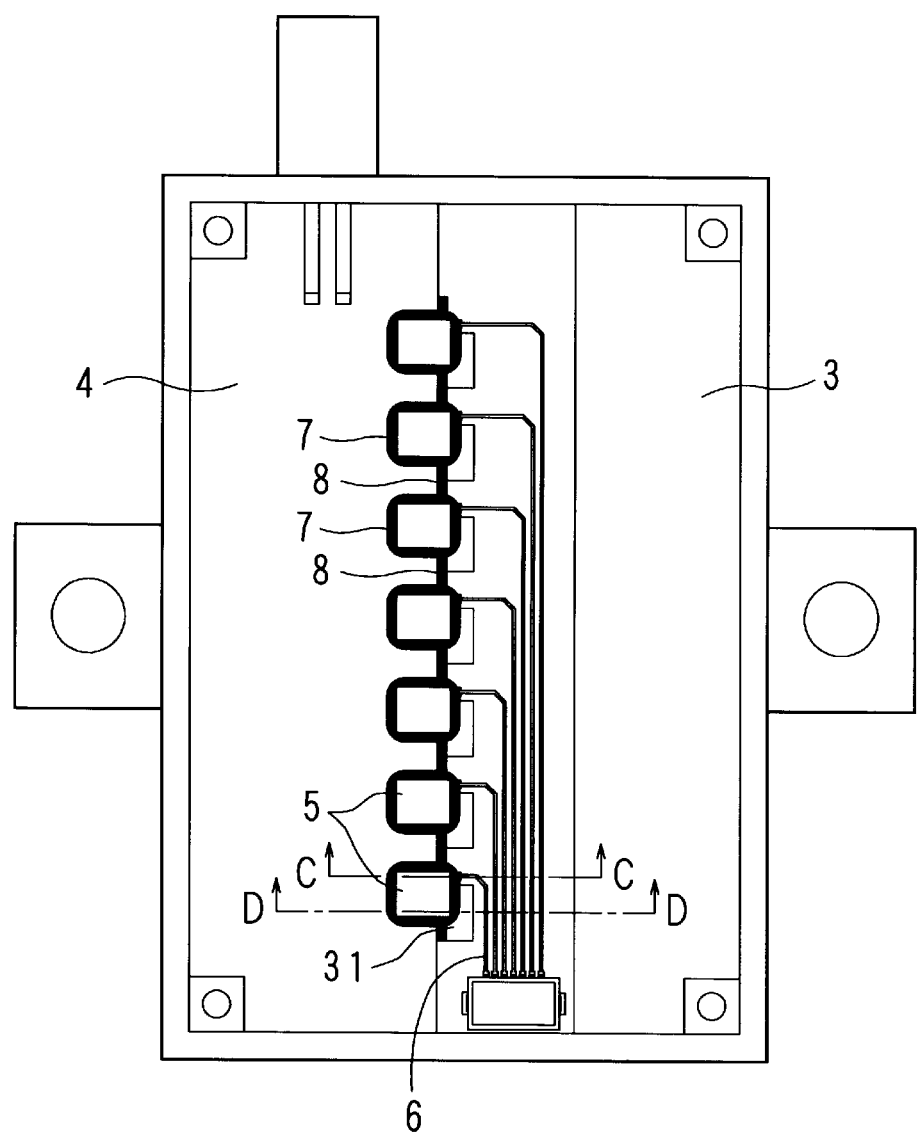
FIG. 9 is a plan view of an electrical connection box including a circuit board after resin molding.

FIG. 9 is a plan view of the electrical connection box 100 including the circuit board 1 after resin molding. FIG. 9 shows a state in which resin molding has been carried out on the peripheral edges of the external peripheral devices 54 of the electronic components 5 and the resin molded portions 7 have been formed after the electronic components 5 are mounted, and corresponds to the plan view of FIG. 1.

Resin molding is carried out on the peripheral edge of the external peripheral device 54 of each electronic component 5. The resin molded portion 7 is formed through resin molding so as to surround the peripheral edge of the external peripheral device 54 of the electronic component 5. That is, the resin molded portion 7 is provided so as to cover the joined portion between the first terminal 51 of the electronic component 5 and the conductive plate 3, the joined portion between the second terminal 52 and the end portion 61 of the signal circuit 6, and the joined portion between the third terminal 53 and the second conductive plate 4 from the surface side of the circuit board 1 (the surface side of the second conductive plate 4 or the like).

As described above, the solder paste 9 is applied to these joined portions, and the resin molded portion 7 is provided so as to cover all of the joined portions joined using the solder paste 9 from the surface side of the circuit board 1. Due to the resin molded portion 7, it is possible to improve the joining strength of the joined portion between the first terminal 51 of the electronic component 5 and the conductive plate 3, the joined portion between the second terminal 52 and the end portion 61 of the signal circuit 6, and the joined portion between the third terminal 53 and the second conductive plate 4.

The resin of the resin molding further fills the groove 24, and the columnar rod body 8 is formed by the resin of the resin molding filling the groove 24. Accordingly, the gap formed between the conductive plate 3 and the second conductive plate 4 (see FIG. 2) is filled in by the resin forming the holding member 2 (forming a portion of the mounting plate portion 22) that fills each end portion in the longitudinal direction of the gap (see FIG. 3), and the resin (rod body 8) forming the resin molded portion 7 that fills the remaining portion other than the end portions in the longitudinal direction of the gap.

The rod body 8 is formed by filling in (sealing) the groove 24. The outer peripheral surface of the groove 24 is constituted by the side surface of the second conductive plate 4, the side surfaces of the protrusions 31 of the conductive plate 3, the side surface of the thin portion 33 of the conductive plate 3, and the side surface of the mounting plate portion 22. Accordingly, the rod body 8 is provided with the outer peripheral surface of the rod body 8 in close contact with the side surface of the second conductive plate 4, the side surface of the protrusion 31 of the conductive plate 3, the side surface of the thin portion 33 of the conductive plate 3, and the side surface of the mounting plate portion 22. As a result, the adhesiveness between the second conductive plate 4, the conductive plate 3, and the mounting plate portion 22 can be improved with the rod body 8 used as the core.

The rod body 8 and the resin molded portion 7 provided on the peripheral edge of the external peripheral device 54 of each of the electronic components 5 are continuous. Since the rod body 8 is provided so as to seal the groove 24, the rod body 8 has high fixability. Since each of the resin molded portions 7 is provided joined to the rod body 8, the fixability of each of the resin mold portions 7 can be improved.

The resin forming the resin molded portions 7 is, for example, a thermosetting resin such as an epoxy resin, and is called a potting mold resin. The coefficient of linear expansion of the resin forming the resin molded portion 7 is smaller than the coefficient of linear expansion of the resin forming the holding member 2. For example, if the resin forming the resin molded portion 7 is an epoxy resin, the coefficient of linear expansion is 30×10 (to the power of −6)/° C. (30[10^(−6)/K]: ^(−6) is to the power of −6). For example, if the resin forming the holding member 2 is a PPS resin, the coefficient of linear expansion is 40×10 (to the power of −6)/° C. (40 [10^(−6)/K]). If the holding member 2 made of PPS resin exceeds the glass transition temperature within the used temperature range, the coefficient of linear expansion becomes even larger. In contrast, if the resin molded portion 7 made of epoxy resin does not exceed the glass transition temperature within the used temperature range, the coefficient of linear expansion does not change. Accordingly, the resin molded portion 7 can suppress an increase in the linear expansion difference between the conductive plate 3 or the second conductive plate 4 and the holding member 2 due to a temperature change to the high temperature side in particular. It should be noted that the used temperature range is the range of the temperature of the surrounding area (ambient temperature) of the electrical connection box 100 (circuit board 1) during starting or stopping of the vehicle when the electrical connection box 100 including the circuit board 1 is mounted in, for example, the engine room of the vehicle, and the used temperature range may be determined based on, for example, an automobile standard (JASO D 014-4: climate load) or ISO 16750-4. In this case, one example of the used temperature range is −40° C. to 120° C.

By making the coefficient of linear expansion of the resin forming the resin molded portion 7 smaller than the coefficient of linear expansion of the resin forming the holding member 2 in this manner, it is possible to improve the joining force with respect to thermal shock in the joined portion between the first terminal 51 of the electronic component 5 and the conductive plate 3, the joined portion between the second terminal 52 and the end portion 61 of the signal circuit 6, and the joined portion between the third terminal 53 and the second conductive plate 4. Furthermore, since the resin forming the rod body 8 is the same as the resin forming the resin molded portion 7, the influence that thermal shock has on the rod body 8 can be reduced similarly to the resin molded portion 7. By filling the region between the second conductive plate 4 and the conductive plate 3 and holding member 2 with a resin different from the resin of the holding member 2 (resin forming the resin molded portion 7), it is possible to mitigate stress that occurs due to a difference in material coefficients or physical property values such as the coefficient of linear expansion in each component, and it is possible to improve the connectivity of these components.

Figure 10:
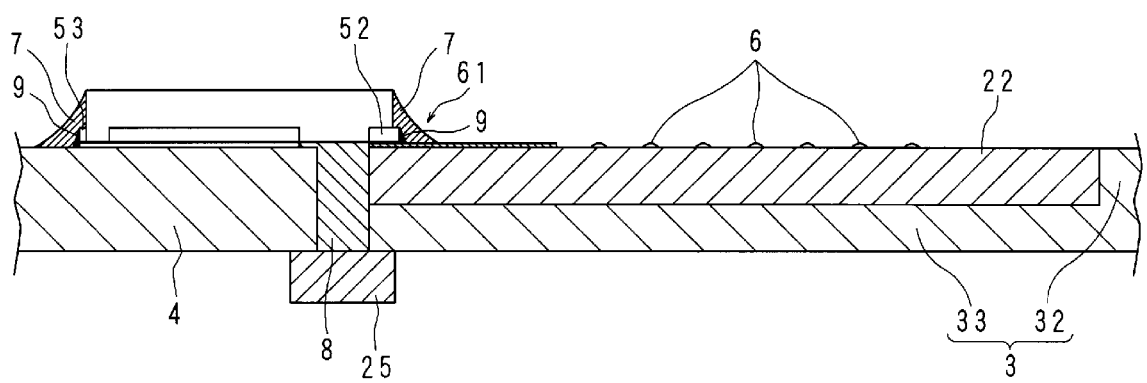
FIG. 10 is a schematic cross-sectional view of a main part (C-C) of a circuit board.

FIG. 10 is a schematic cross-sectional view of a main part (C-C) of the circuit board 1. FIG. 10 schematically shows a cross section (C-C) of FIG. 9, and is a schematic cross-sectional view in a state where resin molding has been carried out and the resin molded portion 7 has been formed.

Due to the resin molding being carried out, the joined portion between the second terminal 52 of the electronic component 5 and the end portion 61 of the signal circuit 6 and the joined portion between the third terminal 53 and the second conductive plate 4 are covered by the resin molded portion 7. The second terminal 52 and the end portion 61 of the signal circuit 6 are joined using the solder paste 9, the third terminal 53 and the second conductive plate 4 are joined using the solder paste 9, and the resin molded portion 7 covers these joined portions as well as the solder paste 9. The resin forming the resin molded portion 7 fills in the groove 24 (see FIGS. 7 and 8), and the columnar rod body 8 is formed due to the groove 24 being filled in.

Since the groove 24 is closed by the bottom lid portion 25 provided on the underside surface side of the circuit board 1, the resin forming the resin molded portion 7 fills in the groove 24 without flowing out from the groove 24 to the underside surface side of the circuit board 1. The bottom lid portion 25 provided on the underside surface side of the circuit board 1 blocks the resin (resin forming the resin molded portion 7) poured into the groove 24, and thus the rod body 8 can be efficiently formed.

The rod body 8 is in close contact with the second conductive plate 4, the thin portion 33 of the conductive plate 3, the mounting plate portion 22, the bottom lid portion 25, and the underside surface of the external peripheral device 54 of the electronic component 5, and thus it is possible to mitigate stress that occurs due to a difference in material coefficients or physical property values such as the coefficient of linear expansion of each component, and the connectivity of these parts can be improved.

Figure 11:
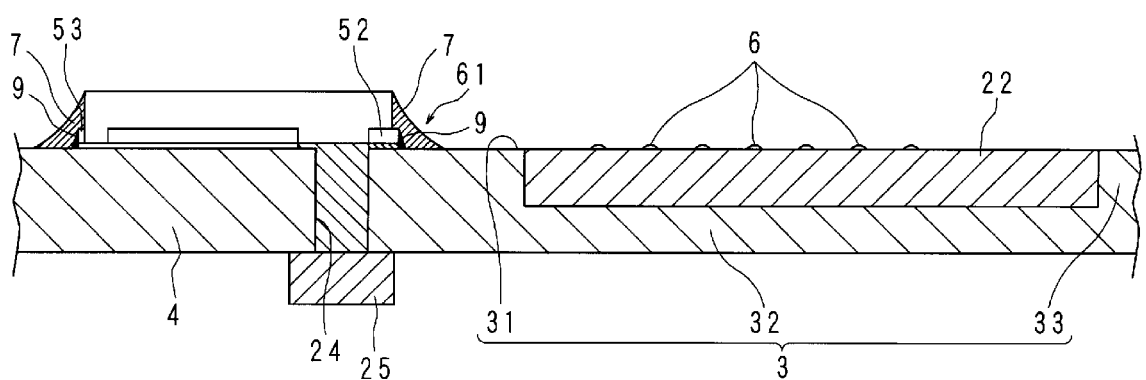
FIG. 11 is a schematic cross-sectional view of a main part (D-D) of a circuit board.

FIG. 11 is a schematic cross-sectional view of a main part (D-D) of the circuit board 1. FIG. 11 schematically shows the (D-D) cross section of FIG. 9, and is a schematic cross-sectional view in a state where resin molding has been carried out and the resin molded portion 7 has been formed.

Due to resin molding being carried out, the joined portion between the first terminal 51 of the electronic component 5 and the protrusion 31 of the conductive plate 3 and the joined portion between the third terminal 53 and the second conductive plate 4 are covered by the resin molded portion 7. The first terminal 51 and the protrusion 31 of the conductive plate 3 are joined using the solder paste 9, the third terminal 53 and the second conductive plate 4 are joined using the solder paste 9, and the resin molded portion 7 covers these joined portions as well as the solder paste 9.

The rod body 8 is in close contact with the second conductive plate 4, the protrusion 31, the bottom lid portion 25 of the conductive plate 3, and the underside surface of the external peripheral device 54 of the electronic component 5, and thus it is possible to mitigate stress that occurs due to differences in material coefficients or physical property values such as the coefficient of linear expansion of each component, and the connectivity of these components can be improved.

According to the present embodiment, since the signal circuit 6 joined to the second terminal 52 of the electronic component 5 is formed using a conductive copper nanoink, it is possible to provide the circuit board 1, on which is mounted an electronic component 5 in which the terminal pitch (distance between terminals) of the first terminal 51 and the second terminal 52, which are arranged side by side, is narrow.

If the electronic component 5 is an n-type FET, the second terminal 52 (gate terminal) into which the control signal is input is electrically connected to the end portion 61 of the signal circuit 6 made of the conductive copper nanoink, whereby the need for the bus bar for the second terminal 52 (gate terminal) can be eliminated. The size of the end portion 61 of the signal circuit 6 is smaller than that of a plate member such as a bus bar. Accordingly, an electronic component 5 having a small terminal pitch between the first terminal 51 (source terminal) joined to the conductive plate 3 (output bus bar) and the second terminal 52 (gate terminal) joined to the end portion 61 of the signal circuit 6 can be mounted on the circuit board 1 (bus bar insert board) that is insert-molded using the conductive plate 3 and the second conductive plate 4.

Since a component that functions as a flux such as an amine-based organic compound is blended into the conductive copper nanoink, the wettability with respect to solder can be improved. Therefore, when the second terminal 52 of the electronic component 5 and the end portion 61 of the signal circuit 6 are joined using the solder paste 9, the joining force can be improved.

Due to resin molding being carried out, resin molding is provided so as to cover the joined portions joined using the solder paste 9, such as the joined portion between the second terminal 52 of the electronic component 5 and the end portion 61 of the signal circuit 6. Accordingly, the joining force of the joined portions joined using the solder paste 9 can be improved.

Since the coefficient of linear expansion of the resin of the resin molded portion 7 is smaller than the coefficient of linear expansion of the resin of the holding member 2, the yield strength with respect to thermal shock the occurs due to heat generation resulting from current flowing through the electronic component 5 can be improved, and it is possible to suppress a decrease in the joining force at the joined portion. Also, due to the resin of the resin molded portion 7 filling the groove 24 to form the rod body 8, it is possible to mitigate stress that occurs due to a difference in the material coefficient or the like of each component (conductive plate 3, second conductive plate 4, holding member 2 (mounting plate portion 22, bottom lid portion 25), electronic component 5) located in the surrounding area of the rod body 8, and the connectivity of these components can be improved.

By using the protrusion 31 provided on the conductive plate 3 as a portion at which the first terminal 51 is to be mounted, it is possible to eliminate the need for other connecting components (connection points) interposed between the conductive plate 3 and the first terminal 51, it is possible to reduce the electric resistance between the first terminal 51 of the electronic component 5 and the conductive plate 3, and the amount of heat generated during energization can be suppressed.

FIG. 12, FIG. 13, FIG. 14, FIG. 15, FIG. 16, FIG. 17, FIG. 18, FIG. 19 and FIG. 20 are illustrative views of a method for manufacturing the electrical connection box 100 including the circuit board 1. A method for manufacturing the electrical connection box 100 including the circuit board 1 according to the first embodiment will be described below with reference to FIGS. 12 to 20.

Figure 12:
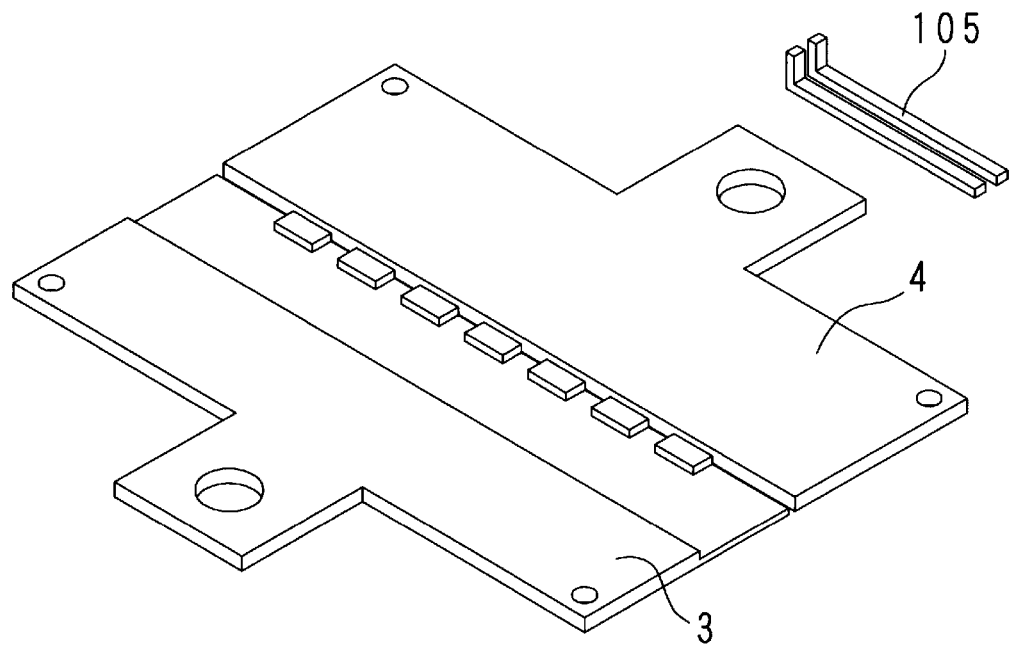
FIG. 12 is an illustrative diagram showing a method for manufacturing an electrical connection box including a circuit board.
Figure 13:
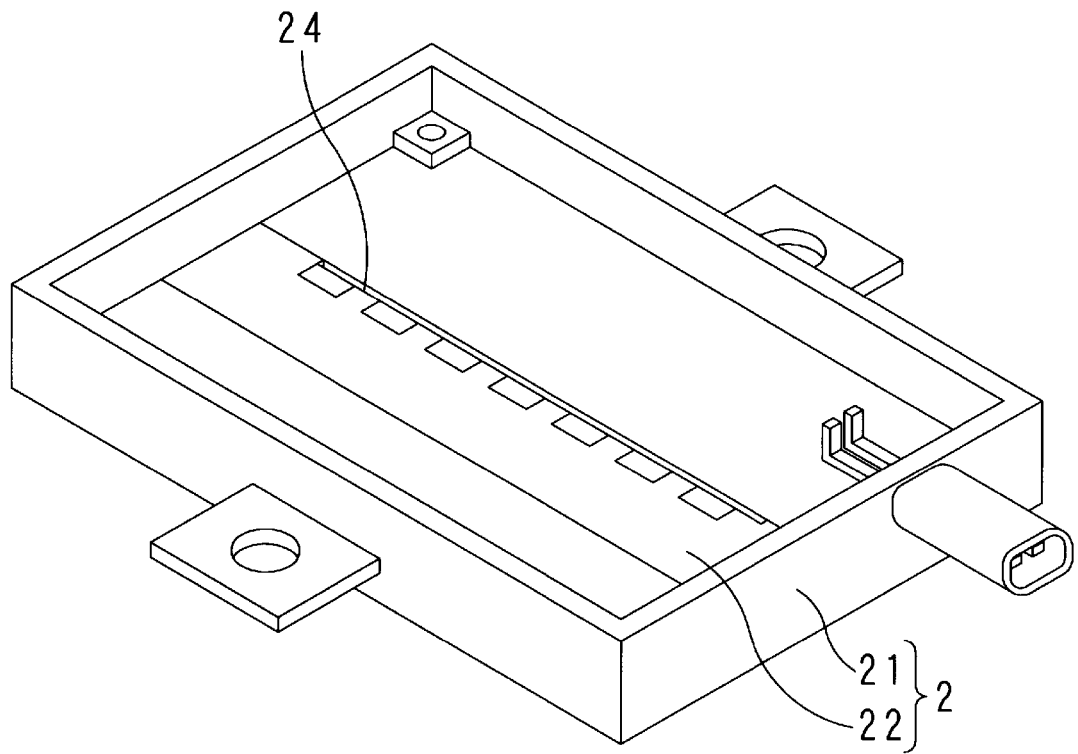
FIG. 13 is an illustrative diagram of a method for manufacturing an electrical connection box including a circuit board.

First, the side surfaces (edges) of the conductive plate 3 (output bus bar) and the second conductive plate 4 (input bus bar) are arranged side by side in the stated order facing each other and with a gap between the side surfaces (see FIG. 12). The conductive plate 3 and the second conductive plate 4 are produced, for example, by cutting or pressing a plate material of pure copper or a copper alloy having a plate thickness of 2 mm to 3 mm. The surfaces of the conductive plate 3 and the second conductive plate 4 may be nickel-plated. The protrusions 31 are provided on the edge side in the lateral direction (long side) of the surface of the conductive plate 3, for example, through cutting or pressing. The edge of the conductive plate 3 on which the protrusions 31 are provided opposes the edge in the lateral direction (long side) of the second conductive plate 4. The connector terminal 105 is further prepared.

Next, the conductive plate 3, the second conductive plate 4, and the connector terminal 105 are arranged in a mold for insert molding and are molded in one piece by an injection molding device. As the molding resin, for example, a thermoplastic resin having high heat resistance such as PPS (polyphenylene sulfide) is used (see FIG. 13). The outer frame 21 forming the outer shell of the electrical connection box 100 is formed so as to be in the form of a case. The upper surface (surface) of the protrusion 31 of the conductive plate 3, the surface of the thick portion 32 of the conductive plate 3, and the surface of the second conductive plate 4 are exposed, and the mounting plate portion 22 is formed such that each of these surfaces and the surface (mounting surface) of the mounting plate portion 22 made of resin on the surface of the thin portion 33 of the conductive plate 3 are on the same plane (flush with each other). The conductive plate 3, the second conductive plate 4, and the mounting plate portion 22 formed on the same plane in this manner form the base portion of the circuit board 1 (bus bar insert substrate). The bottom lid portion 25 (see FIGS. 10 and 11) is formed so as to bridge across the inner peripheral surfaces of the outer frame 21 that face each other. A groove 24 with an interval of, for example, 1 mm is provided between the side surfaces of the protrusions 31 of the conductive plate 3 and the side surface of the second conductive plate 4, and the bottom of the groove 24 has a pocket shape that is closed by the bottom lid portion 25.

Figure 14:
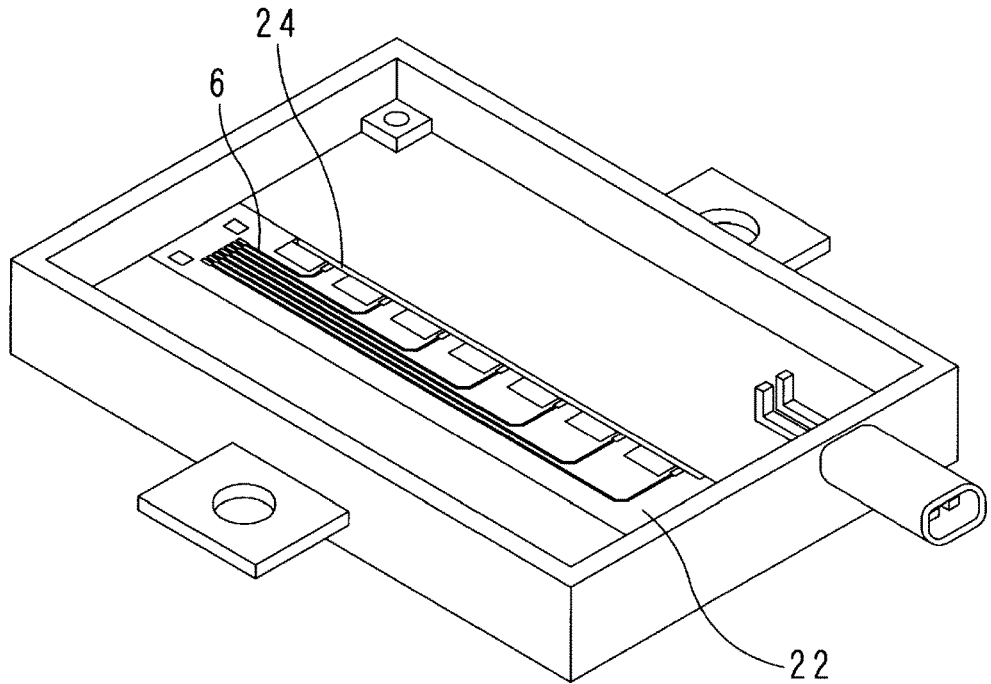
FIG. 14 is an illustrative diagram of a method for manufacturing an electrical connection box including a circuit board.

Next, using a screen printing machine, conductive copper nanoink is printed in the shape of the signal circuits 6 on the surface (mounting surface) of the mounting plate portion 22 made of resin (see FIG. 14). The conductive copper nanoink has a characteristic of exhibiting conductivity when melted through firing, and the melting point of a metal such as copper is dramatically lowered by making it into ultrafine particles. Accordingly, copper wiring is formed by firing at a temperature of about 120° C., and signal circuits 6 capable of electrical joining are formed. The conductive copper nanoink is printed such that the width of each end portion 61 of the signal circuits 6 is wider than the width of the linear portion other than the end portion 61. The conductive copper nanoink is a conductive ink that contains a component that functions as a flux, such as an amine-based organic compound for improving wettability with respect to solder, and can be soldered using a solder paste.

Figure 15:
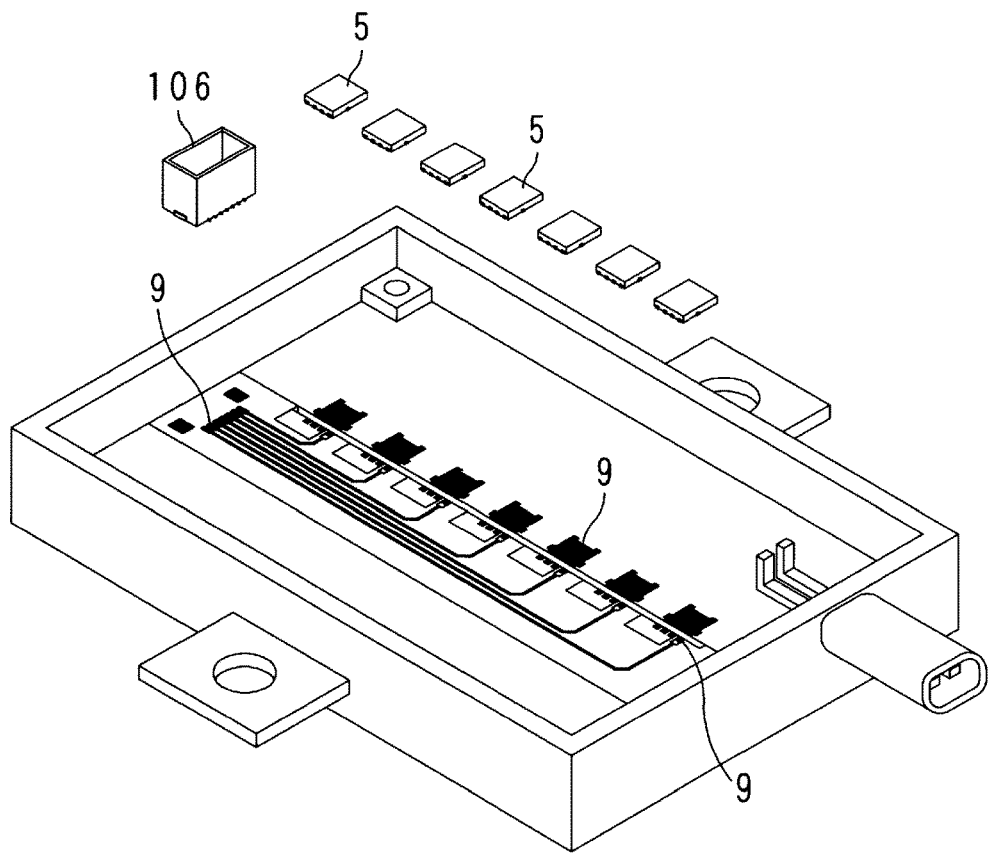
FIG. 15 is an illustrative diagram of a method for manufacturing an electrical connection box including a circuit board.
Figure 16:
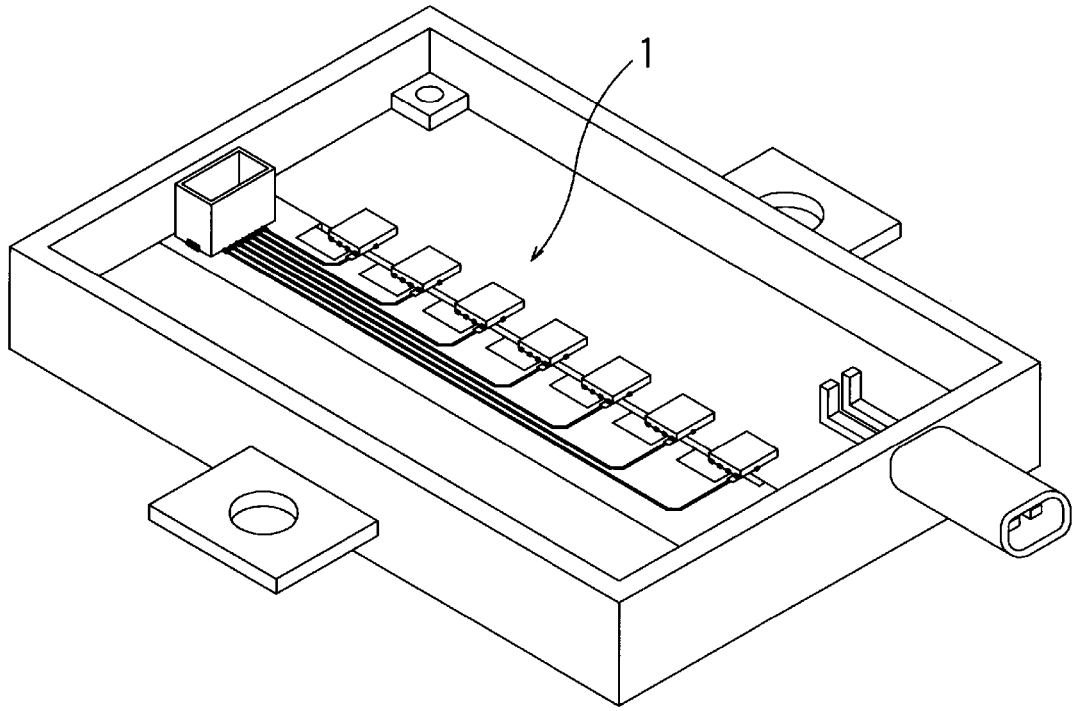
FIG. 16 is an illustrative diagram of a method for manufacturing an electrical connection box including a circuit board.
Figure 17:
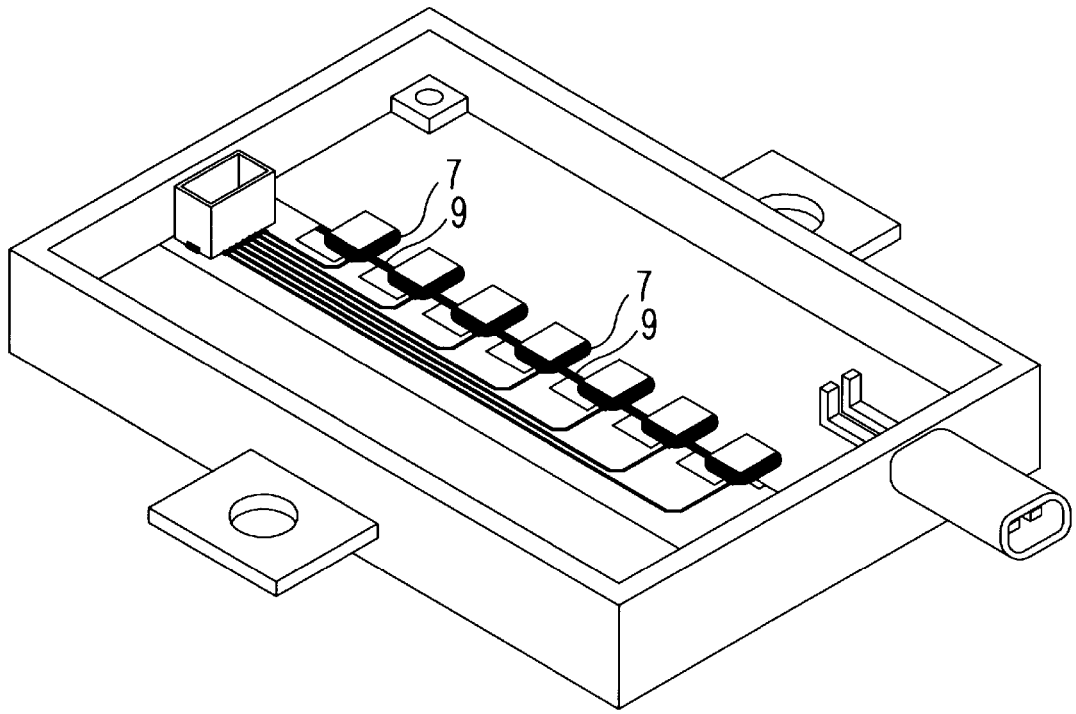
FIG. 17 is an illustrative diagram of a method for manufacturing an electrical connection box including a circuit board.

Next, the solder paste 9 is applied to the end portions 61 of the signal circuits 6, predetermined locations on the upper surfaces of the protrusions 31 of the conductive plate 3, and a predetermined location on the upper surface of the second conductive plate 4 (see FIG. 15). A plurality of electronic components 5 (seven in the drawing) are arranged side by side such that each terminal (51, 52, 53) is placed on the applied solder paste 9, and each of these electronic components 5 is mounted on the second conductive plate and the protrusions 31 of the conductive plate 3 so as to straddle the groove 24 located between the second conductive plate and the protrusions 31 of the conductive plate 3. Accordingly, the plurality of electronic components 5 are arranged side by side along the longitudinal direction of the groove 24.

The electronic component 5 is, for example, a semiconductor switch such as an n-type FET. If the electronic component 5 is an n-type FET, the first terminal 51 (source terminal) is placed on the region of the protrusion 31 of the conductive plate 3 where the solder paste 9 has been applied. The second terminal 52 (gate terminal) is placed on the region of the end portion 61 on the electronic component side of the signal circuit 6 where the solder paste 9 has been applied. The third terminal 53 (drain terminal) is placed on the region of the second conductive plate 4 where the solder paste 9 has been applied.

Furthermore, each substrate connection connector 106 is aligned with an end portion 61 of a signal circuit 6 provided on the end portion side in the longitudinal direction of the mounting plate portion 22, and is mounted on the surface of the mounting plate portion 22. The plurality of electronic components 5 and the substrate connection connector 106 are mounted, and the result is subjected to soldering in a reflow furnace. As a result, an electrical connection box 100 that includes (accommodates) the circuit board 1 (bus bar insert board) on which the electronic components 5 are mounted is generated (see FIG. 16).

Next, resin molding is carried out on the peripheral edges of the groove 24 and the external peripheral devices 54 of the electronic components 5. The resin of the resin molding is a thermosetting resin such as an epoxy resin, and the resin fills (is potted in) the groove 24. By carrying out resin molding on the peripheral edges of the external peripheral devices 54 of the electronic components 5, the resin of the resin molding covers the joined portions joined using the solder paste 9. As the resin of the resin molding, a resin may be used which is filled with a filler such as silica so as to have a glass transition temperature greater than or equal to the used environment temperature of the product, and which further has a thixotropic property. By curing at 80° C. in this state, the resin of the resin molding integrates with other components such as the electronic components 5 to form the resin molded portions 7 and the rod body (see FIG. 17).

Figure 18:
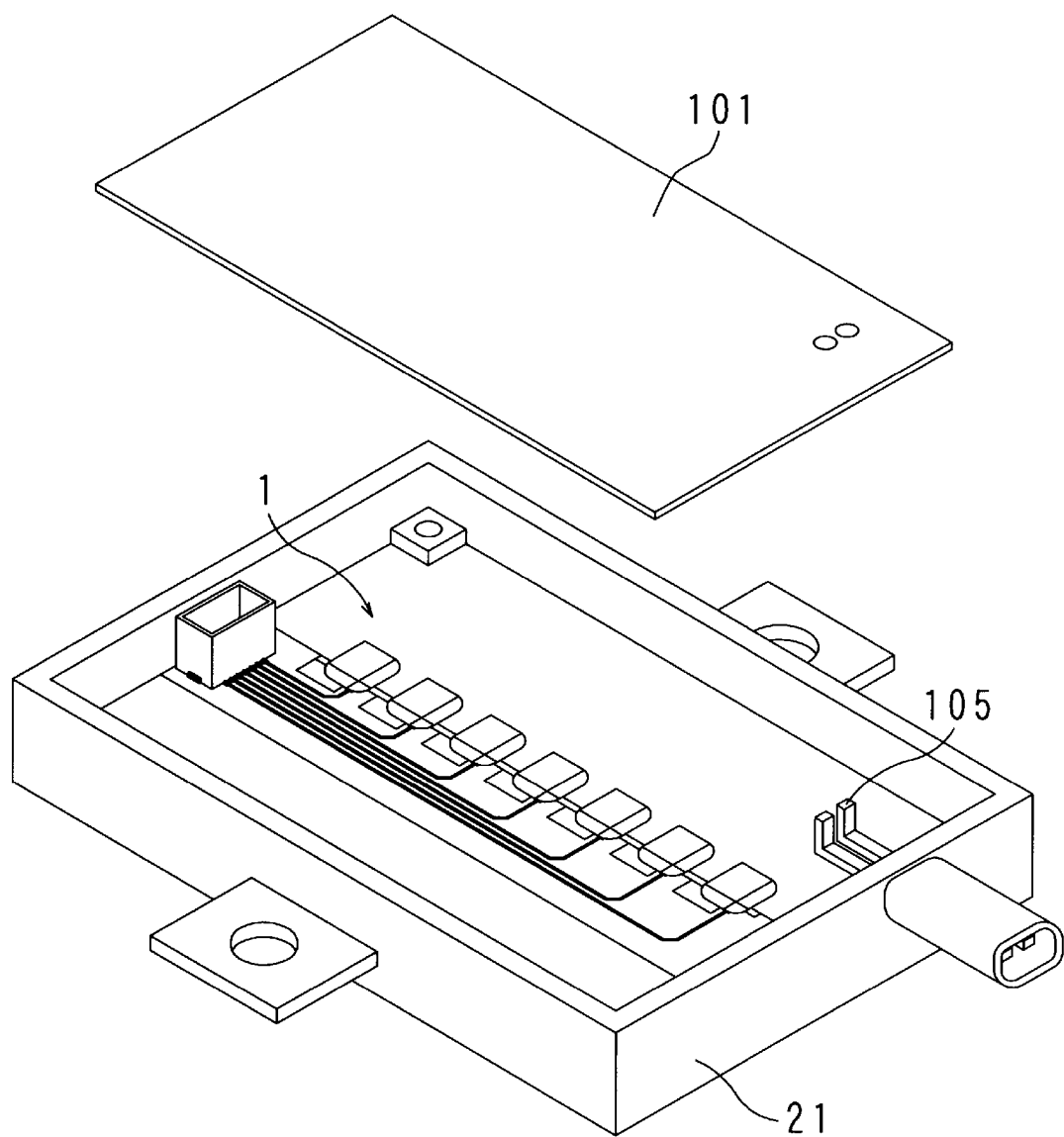
FIG. 18 is an illustrative diagram of a method for manufacturing an electrical connection box including a circuit board.

Next, the control circuit board 101 on which the electronic component 5 such as a microcomputer is mounted is fitted inside of the outer frame 21, and the terminal (not shown) of the control circuit board 101 and the connector terminal 105 are joined to each other using solder and are electrically connected to each other (see FIG. 18). By fitting the control circuit board 101 inside of the outer frame 21, the signal terminals provided on the control circuit board 101 are joined to the substrate connection connector 106, and a voltage (duty) that is to be a control signal output from the control circuit board 101 is applied (input) to the second terminal 52 (gate terminal) of the electronic component 5 (n-type FET). Due to the terminal of the control circuit board 101 and the connector terminal 105 being joined together using solder, a signal transmitted from the outside of the electrical connection box 100 can be input to the control circuit board 101, and upon receiving the signal, the microcomputer on the control circuit board 101 can output a control signal to the electronic component 5 to enable an operation for switching on/off the electronic components 5 (n-type FET).

Figure 19:
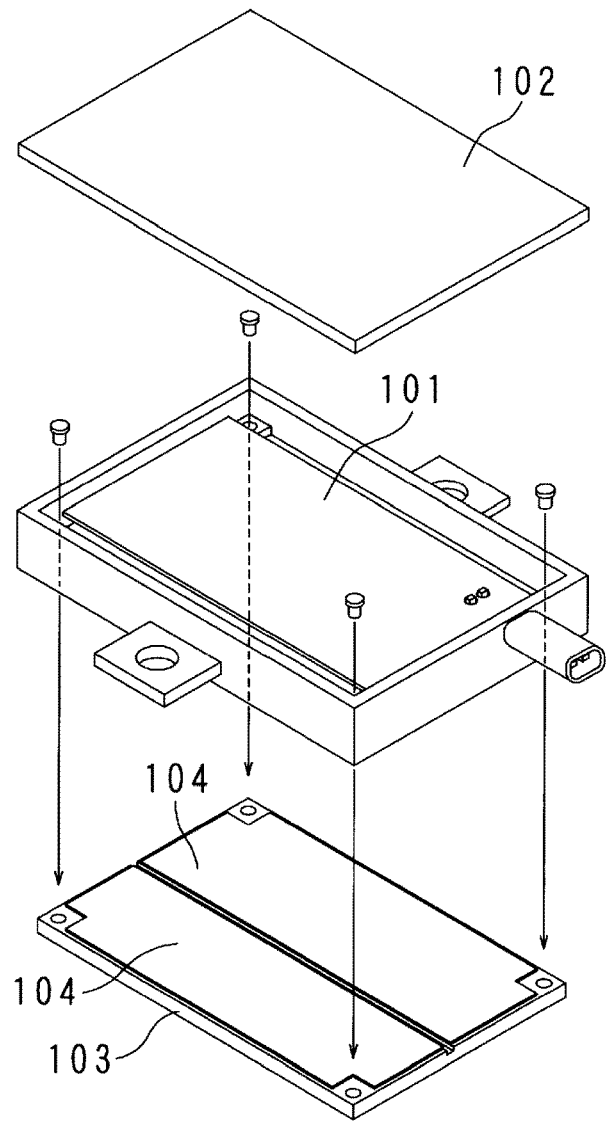
FIG. 19 is an illustrative diagram of a method for manufacturing an electrical connection box including a circuit board.
Figure 20:
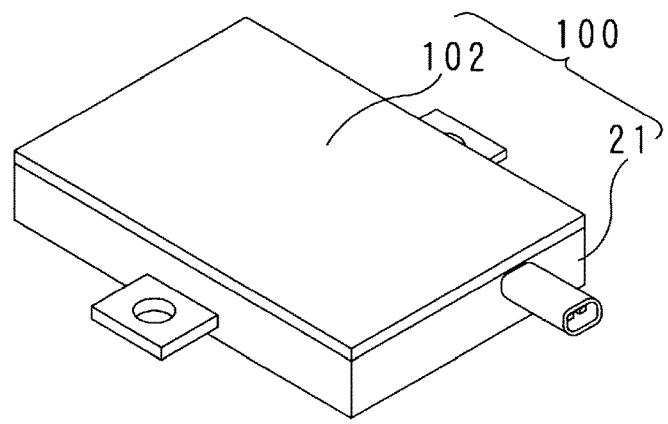
FIG. 20 is an illustrative diagram of a method for manufacturing an electrical connection box including a circuit board.

Next, a heat sink 103 using a metal having high thermal conductivity such as aluminum is fixed to the holding member 2 with screws (see FIG. 19). A thin plate-shaped or sheet-shaped heat dissipating material 104 (heat transfer promoting material) is provided on the surface of the heat sink 103. The heat dissipating material 104 has an insulating property, and brings the heat sink 103 and the conductive plate 3 and second conductive plate 4 into contact with each other to be thermally connected while insulating the heat sink 103 and the conductive plate 3 and second conductive plate 4 from each other. When fixing the heat sink 103 to the holding member 2, the surface of the heat dissipating material 104 is brought into contact with the underside surfaces of the conductive plate 3 and the second conductive plate 4, and the heat sink 103 is fixed to the holding member 2 with screws. The heat dissipating material 104 is interposed between the heat sink 103 and the conductive plate 3 and second conductive plate 4, and the conductive plate 3 and second conductive plate 4 and the heat sink 103 are thermally connected to each other via the heat dissipating material 104. Accordingly, the heat generated by the electronic component 5 and the like can be transmitted to the heat sink 103 via the conductive plate 3 and the second conductive plate 4, and thus the heat dissipation property can be improved.

Next, the upper lid 102 is fixed to the holding member 2 (see FIG. 19). The electrical connection box 100 is completed by fixing the upper lid 102 to the holding member 2 so as to cover the conductive plate 3 and the second conductive plate 4 from the surface side. (See FIG. 20)

According to the present manufacturing method, it is possible to efficiently manufacture the electrical connection box 100 including the circuit board 1 on which the electronic component 5 having a narrow terminal pitch can be mounted.

If the electronic component 5 is a semiconductor switch such as an n-type FET, a metal film formed by printing conductive copper nanoink on the mounting plate portion 22 instead of a bus bar for connecting the second terminal 52 (gate terminal) is used. As a result, the end portion 61 of the signal circuit 6 connected to the second terminal 52 (gate terminal) can be arranged close to the conductive plate 3 (output bus bar) connecting the first terminal 51 (source terminal). Accordingly, the electronic component 5 having a narrow pitch between terminals can be mounted on the circuit board 1 (bus bar insert board) generated through insert molding, and it is possible to manufacture an electrical connection box 100 made smaller through high-density mounting.

The embodiments disclosed herein should be considered exemplary in all respects and not restrictive. The scope of the present disclosure is indicated not by the above-described meaning, but by the scope of claims, and is intended to encompass all modifications within the meaning and scope equivalent to the claims.

The invention claimed is:

1. A circuit board on which an electronic component including a first terminal and a second terminal that are arranged side by side is to be mounted, the circuit board comprising:
    an insulating holding member; a conductive plate; and a signal circuit,
    wherein the conductive plate is held by the holding member,
    the first terminal is joined to the conductive plate,
    the signal circuit is formed on a surface of the holding member using conductive nanoink containing a flux, and
    an end portion of the signal circuit and the second terminal are joined to each other using solder,
    resin molding is carried out on the end portion of the signal circuit and the second terminal that are joined to each other using the solder, and
    a coefficient of linear expansion of a resin of the resin molding is smaller than a coefficient of linear expansion of the holding member.

2. The circuit board according to claim 1, further comprising
    a second conductive plate,
    wherein the electronic component further includes a third terminal that is to be joined to the second conductive plate, the second conductive plate and the conductive plate are arranged side by side with a side surface of the second conductive plate and a side surface of the conductive plate facing each other, and the resin of the resin molding fills a region between the side surface of the second conductive plate and the side surface of the conductive plate.

3. The circuit board according to claim 2, wherein a protrusion that protrudes in a vertical-line direction from one surface is provided on one surface of the conductive plate, and the first terminal is joined to the protrusion.

4. A method for manufacturing an electronic connection box including a circuit board, the method comprising:

a step of arranging a conductive plate in a mold, injecting resin in the mold to form a holding member including an outer frame and a mounting plate portion, and integrating the conductive plate and the holding member such that at least a portion of the conductive plate is accommodated in the outer frame;

a step of printing a signal circuit on the mounting plate portion using conductive nanoink containing a flux;

a step of applying solder paste to a predetermined region of the conductive plate and an end portion of the signal circuit;

a step of aligning each of a first terminal and a second terminal of an electronic component with the predetermined region of the conductive plate and the end portion of the signal circuit to which the solder paste has been applied, placing the electronic component, and performing soldering using a reflow furnace;

a step of performing resin potting in a groove formed on a side surface side of the mounting plate portion, and performing resin molding using the same resin as in the resin potting on a peripheral edge of the electronic component so as to include the applied solder paste; and a step of accommodating a control circuit board for controlling the electronic component in the outer frame, and fixing an upper lid and a heat sink so as to close opening portions on both ends of the outer frame, wherein resin molding is carried out on the end portion of the signal circuit and the second terminal that are joined to each other using the solder, and a coefficient of linear expansion of a resin of the resin molding is smaller than a coefficient of linear expansion of the holding member.

* * * * *